(12) United States Patent  
Yih

(10) Patent No.: US 6,376,354 B1
(45) Date of Patent: Apr. 23, 2002

(54) WAFER-LEVEL PACKAGING PROCESS

(75) Inventor: Muh-Min Yih, Hsinchu (TW)

(73) Assignee: Apack Technologies Inc., Hsinchu (TW)

( * ) Notice: Subject to any disclaimer, the term of this patent is extended or adjusted under 35 U.S.C. 154(b) by 0 days.

(21) Appl. No.: 09/854,115

(22) Filed: May 11, 2001

(30) Foreign Application Priority Data

Mar. 22, 2001 (TW) .......................................... 90106705

(51) Int. Cl.$^7$ .......................... H01L 21/44; H01L 21/48; H01L 21/50
(52) U.S. Cl. ........................ 438/613; 438/106; 438/108; 438/612
(58) Field of Search ................................ 438/611, 612, 438/613, 614, 106, 108, 113, 114

(56) References Cited

U.S. PATENT DOCUMENTS

| | | | |
|---|---|---|---|
| 6,222,279 B1 * | 4/2001 | Mis et al. | 257/779 |
| 6,258,705 B1 * | 7/2001 | Chien et al. | 438/614 |
| 6,277,669 B1 * | 8/2001 | Kung et al. | 438/106 |

FOREIGN PATENT DOCUMENTS

WO   WO 96/30933   * 10/1996

* cited by examiner

Primary Examiner—Charles Bowers
Assistant Examiner—Thanhha Pham
(74) Attorney, Agent, or Firm—J.C. Patents

(57) ABSTRACT

A wafer-level packaging process comprising: forming a patterned photoresist on a wafer covering a plurality of scribe lines and bump forming locations; forming a stress buffer layer on the regions not covered by the patterned photoresist; after removal of the patterned photoresist a plurality of first openings are defined in the stress buffer layer that also exposes the scribe lines; arranging either a stencil or a second patterned photoresist having a plurality of second openings over the wafer to cover the stress buffer layer and scribe lines, such that the second openings expose the first openings; filling a solder material in the openings; performing a reflow process, wherein according to the use of either the stencil or second photoresist, the reflow is respectively performed after or before the removal thereof. After dicing, the thus-packaged wafer can be directly connected onto an external carrier.

5 Claims, 4 Drawing Sheets

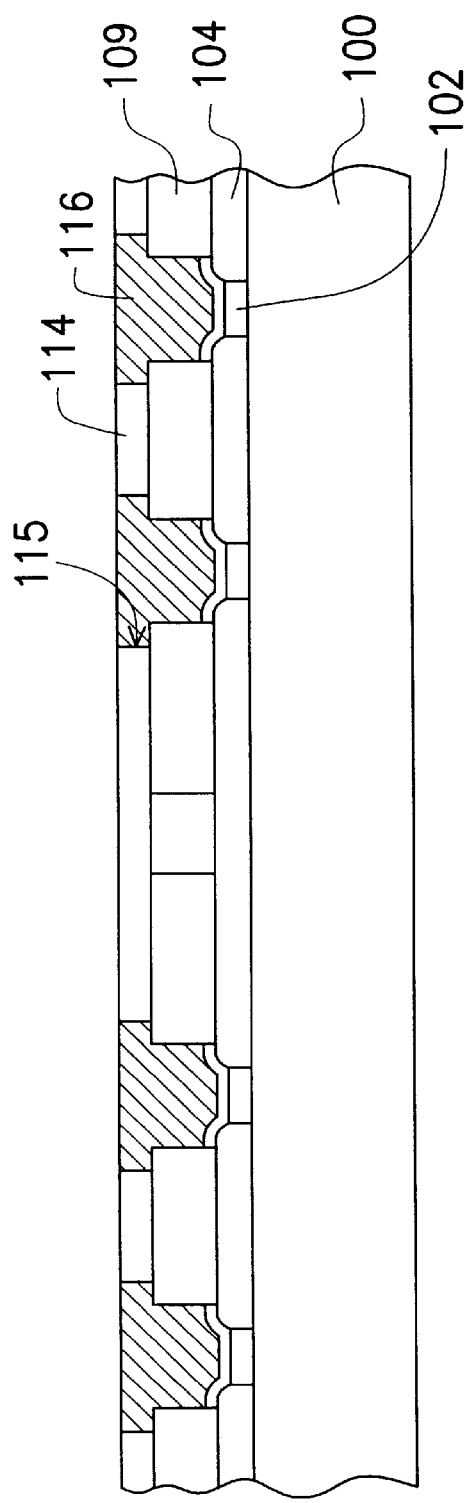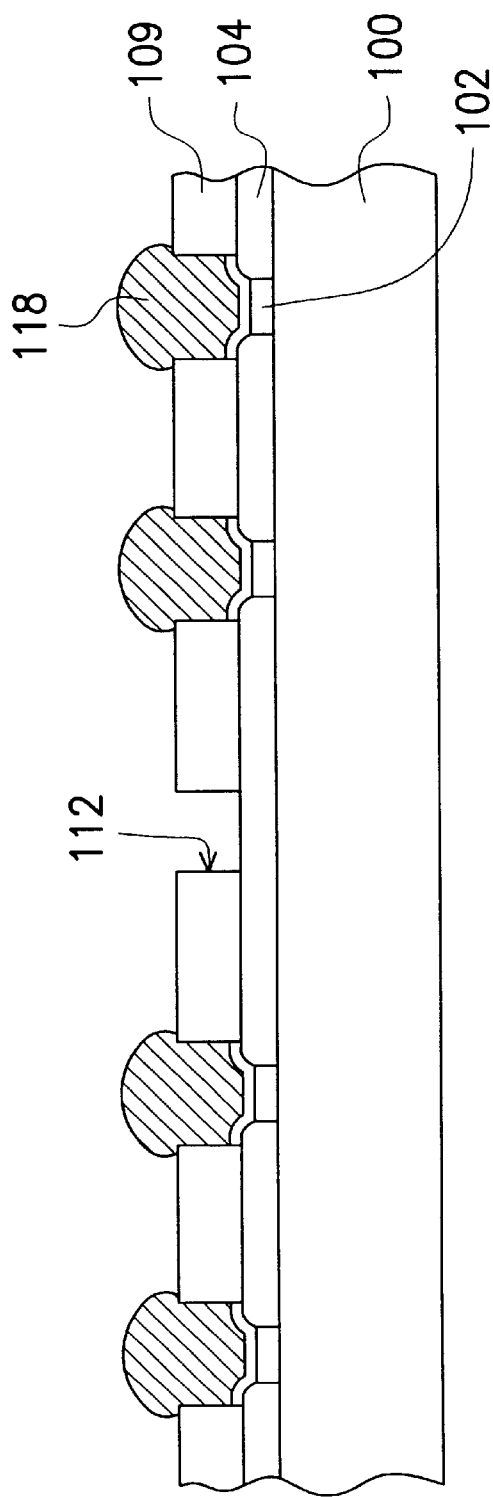

WAFER-LEVEL PACKAGING PROCESS

CROSS-REFERENCE TO RELATED APPLICATION

This application claims the priority benefit of Taiwan application serial no. 90106705, filed on Mar. 22, 2001.

BACKGROUND OF THE INVENTION

1. Field of the Invention

The invention relates to a wafer-level packaging process. More particularly, the invention relates to a wafer-level packaging process which uses a stress buffer layer instead of an underfill on the wafer.

2. Description of the Related Art

As electronic technology progresses, emphasis is more particularly focused on the miniaturization of electronic products. This miniaturization results in electronic products that are more complicated and denser. In the electronics industry, package structures that have small dimensions and high density are required for packaging of electronic devices. Many types of packages have been developed such as ball grid array (BGA) packages, chip-scale packages (CSP), flip-chip (F/C) packages, and multi-chip module (MCM) packages.

Among the above-mentioned types of packages, the flip-chip package provides many advantages, such as small surface area of the package, high pin count, short signal path, low induction and easy control of noise signals. Thus, the flip-chip structure is increasingly used in packaging electronic devices.

In a conventional flip-chip package, an underfill must be formed between the chip and the carrier or printed circuit substrate onto which the chip is connected. The underfill is directed to share the thermal stress generated between the carrier and the chip due to their different coefficients of thermal expansion, such that the bumps that electrically connect the chip to the carrier can be substantially prevented from fatigue due to thermal cycle.

With the increased integration of packaging, the pitch between the bumps formed on the chip is constantly being reduced. For a flip-chip package, an effective filling of underfill, without voids, thus becomes problematic and increases the manufacturing cost. Solutions that can overcome the above-described problems to allow for a reliable flip-chip structure are thus needed.

SUMMARY OF THE INVENTION

It is one object of the present invention is to provide a wafer-level packaging process in which a stress buffer layer is adequately formed on the wafer to substitute for an underfill in a conventional packaging process such that the wafer-level packaging can be simply achieved.

To achieve the foregoing and other objects, the present invention provides a wafer-level packaging process, comprising: providing a wafer that has a plurality of chips formed thereon, each of the chips having a plurality of bonding pads exposed through a passivation layer formed on the surface of the wafer; respectivelyforming an under ball metallurgy (UBM) on each bonding pad; forming a patterned photoresist over the wafer to define a plurality of scribe lines and a plurality of bump forming locations; forming a stress buffer layer in the regions not covered by the patterned photoresist over the wafer; removing the patterned photoresist; applying a stencil having a plurality of openings to the stress buffer layer and the scribe lines, such that the openings expose the bump forming locations; filling a solder material in the openings; removing the stencil; and performing a reflow process to form the bumps at the bump forming locations.

Further, the present invention also provides a wafer-level packaging process comprising: providing a wafer that has a plurality of chips formed thereon, each of the chips having a plurality of bonding pads exposed through a passivation layer formed on the surface of the wafer; forming a first patterned photoresist over the wafer to define a plurality of scribe lines and a plurality of bump forming locations; forming a stress buffer layer in the regions not covered by the first patterned photoresist over the wafer; removing the first patterned photoresist defining a plurality of first openings in the stress buffer layer corresponding to the locations of the bonding pads; forming a UBM on each bonding pad exposed through each first opening, wherein the UBM covers the bonding pad, the sidewalls of the first opening, and overlaps over the stress buffer layer; forming a second patterned photoresist having a plurality of second openings on the stress buffer layer and scribe lines, such that the second openings expose the first openings; filling a solder material in the first and second openings; performing a reflow process to form the bumps; and removing the second patterned photoresist.

After the above-described packaging process, the wafer is diced and is connected onto a carrier by flip chip interconnection technology. With the stress buffer layer substituting for the conventional underfill, the flip-chip package is thus simply obtained with a substantially reduced production cost.

It should be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIG. 1 through FIG. 4 are cross-sectional views schematically illustrating various stages in a wafer-level packaging process according to a first preferred embodiment of the present invention.

DESCRIPTION OF THE PREFERRED EMBODIMENTS

The following detailed description of the embodiments and examples of the present invention with reference to the accompanying drawings is only illustrative and not limiting.

Referring now to FIG. 1 through FIG. 4, various cross-sectional views schematically illustrate various stages in a wafer-level packaging process according to a preferred embodiment of the present invention.

Figure 1:
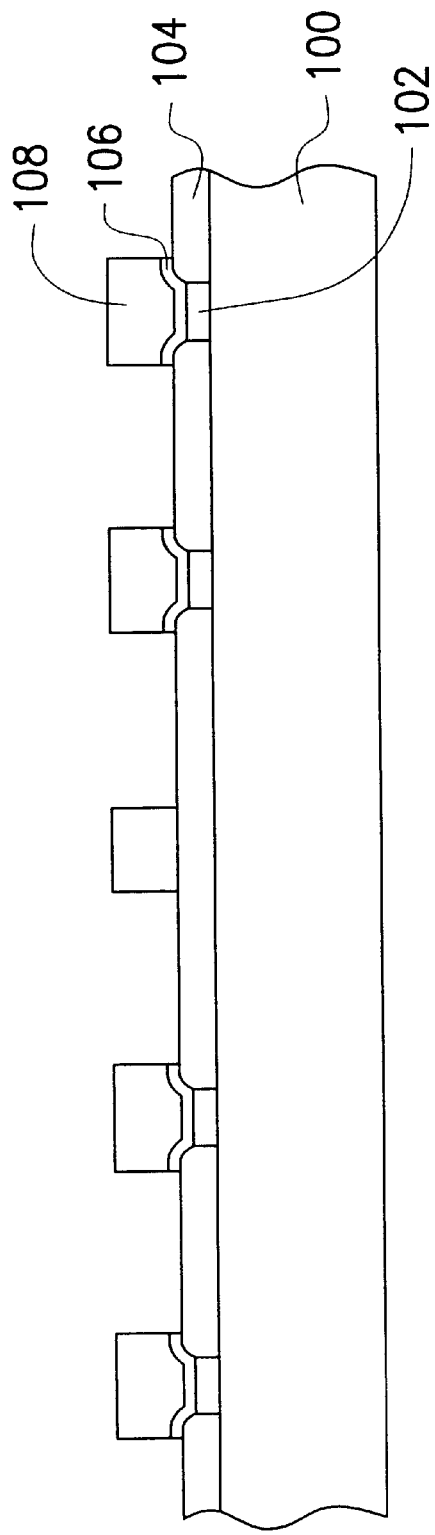

With reference to FIG. 1, a wafer 100 is provided with a plurality of bonding pads 102 thereon. A passivation layer 104 is formed on the surface of the wafer 100 and exposes the bonding pads 102 thereon. An under ball metallurgy (UBM) 106 is respectively formed on the exposed bonding pads 102. The UBM can be made of multi-layers of chromium/chromium-copper/copper, for example. A patterned photoresist 108 is formed over the wafer 100 to cover the UBM 106 and the scribe lines. The patterned photoresist 108 can be, for example, a liquid photoresist or a dry film.

Figure 2:
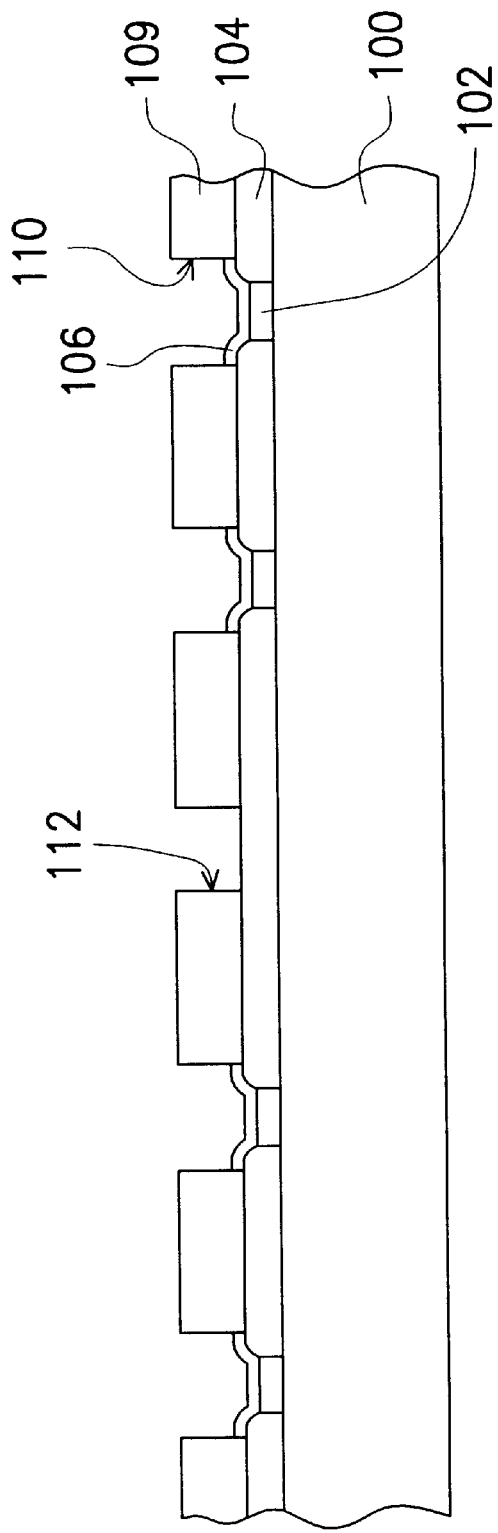

Referring to FIG. 2, a stress buffer layer 109 then is formed in the regions not covered by the patterned photoresist 108. The stress buffer layer 109 can be made of, for example, epoxy, which offers an effective stress buffer. Then, the patterned photoresist 108 is removed such that a plurality of first openings 110 are defined within the stress buffer layer 109 to expose the UBM 106 and the plurality of scribe lines 112. The first openings 110 are the locations where bumps are to be subsequently formed.

Referring to FIG. 3, a stencil 114 then is applied on the stress buffer layer 109 to cover the scribe lines 112. The stencil 114 has a plurality of second openings 115 therein that are aligned with the first openings when the stencil 114 is arranged on the stress buffer layer 109. A solder material 116 is then filled in the first and second openings 110 and 115. As an example, in this embodiment of the present invention, the size of the second openings 115 is greater than that of the first openings 110. The solder material 116 is, for example, a tin-lead paste that can have various ratios $Sn_x Pb_y$, wherein x+y=100. However the solder material 116 also can be composed of other solder constituents not recited in the specification of the present invention.

Referring to FIG. 4, the stencil 114 is then removed to expose the scribe lines 112 for subsequent dicing of the wafer 200. The solder material 116 is then reflowed to form a plurality of bumps 118. The bumps 118, formed by the generation of surface tension during the reflow of the solder material, partially overlap over the stress buffer layer 109.

Referring now to FIG. 5 through FIG. 8, various cross-sectional views schematically illustrate a wafer-level packaging process according to a second preferred embodiment of the present invention.

Figure 5:
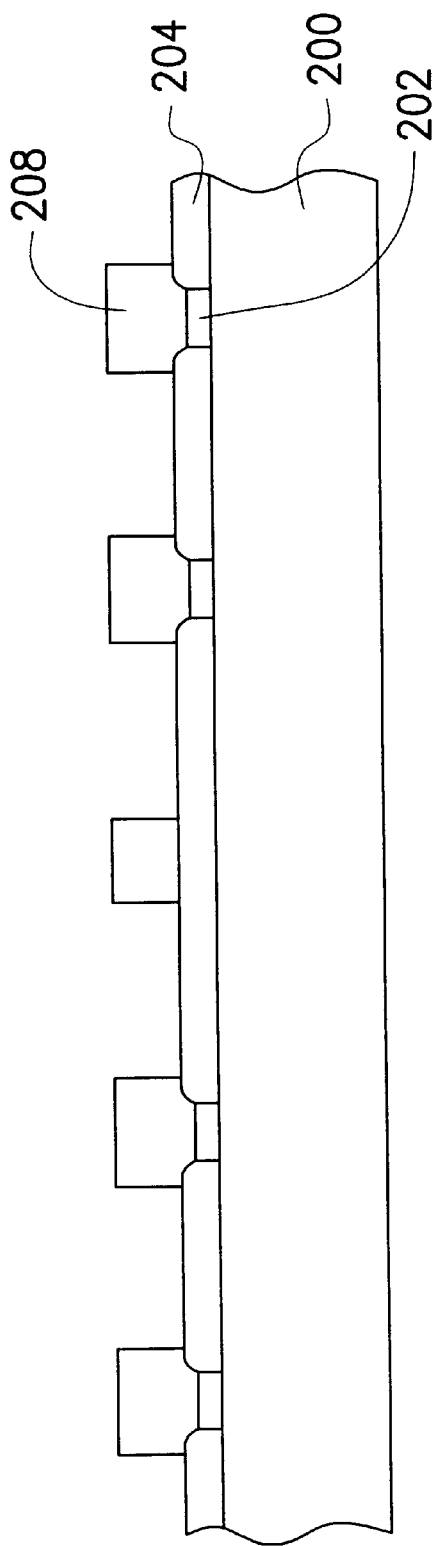
FIG. 5 through FIG. 8 are cross-sectional views schematically illustrating various stages in a wafer-level packaging process according to a second preferred embodiment of the present invention.

With reference to FIG. 5, a wafer 200 is provided with a plurality of chips formed thereon, each chip having a plurality of bonding pads 202 exposed through a passivation layer 204 formed on the wafer 200. A patterned photoresist 208 then is formed on the wafer 200 to cover the bump forming locations and scribe lines. The patterned photoresist 208 can be, for example, a liquid photoresist or a dry film.

Figure 6:
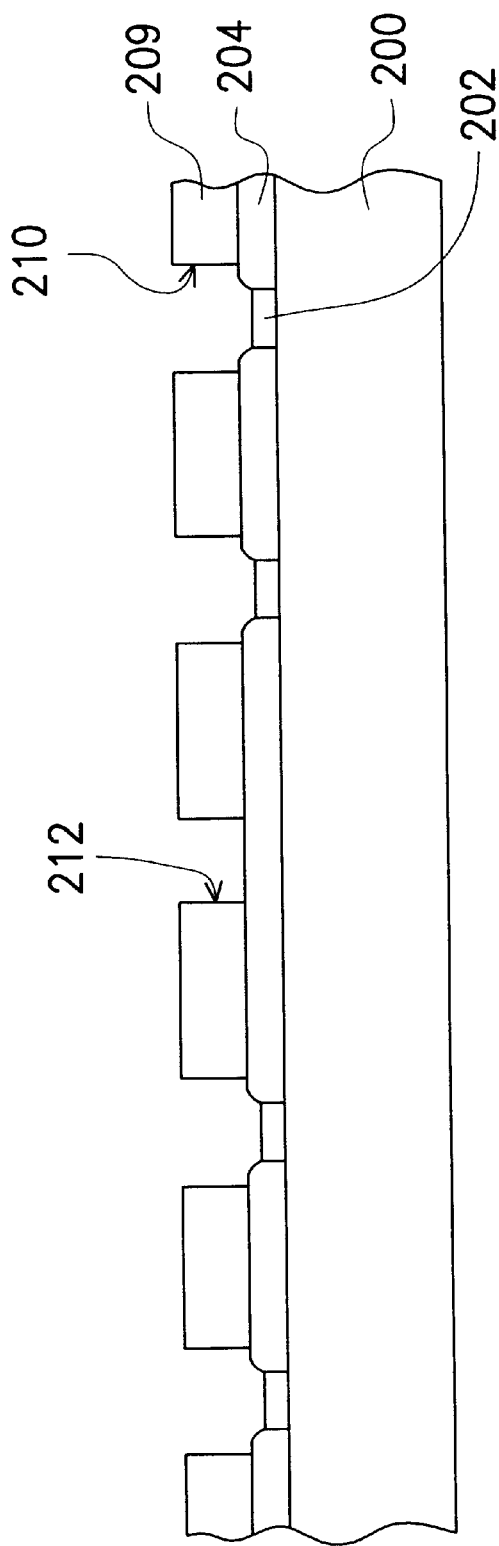

Referring to FIG. 6, a stress buffer layer 209 then is formed in the region that has not been covered by the patterned photoresist 208 over the wafer. The stress buffer layer 209 can be made of, for example, epoxy that offers an effective stress buffer property. Then, the patterned photoresist 208 is removed to form a plurality of first openings 210 exposing the scribe lines 212 and the bonding pads 202 where UBMs 206 are to be formed. The first openings 210 are the locations where bumps are to be subsequently formed.

Figure 7:
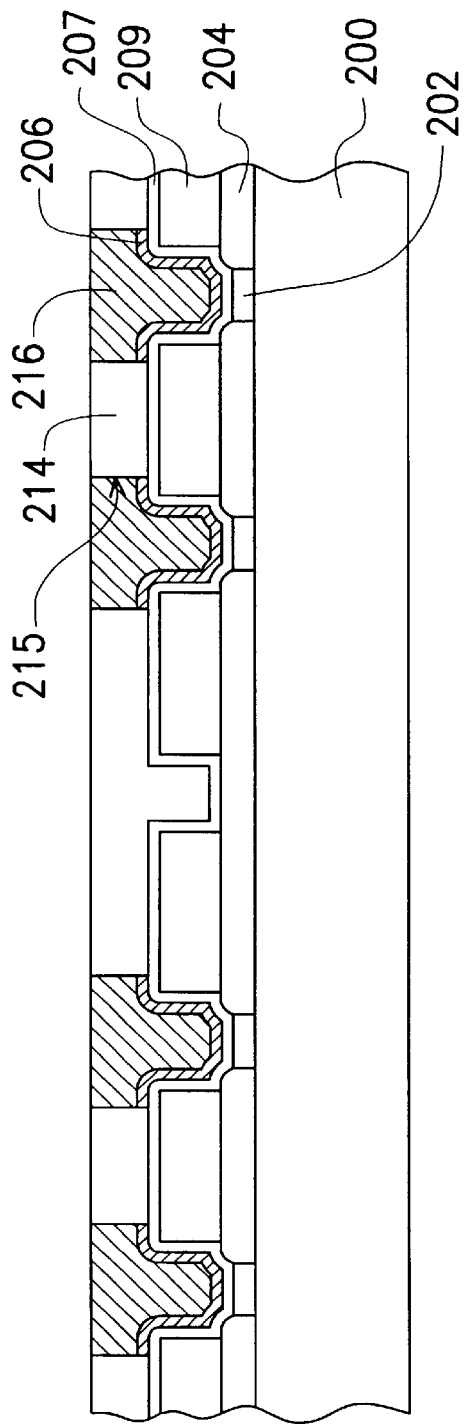

Referring to FIG. 7, an isolation layer is conformally formed covering the bonding pads 202 at the bottom of the first openings 210, the scribe lines 212, and the stress buffer layer 209. Then, a UBM 206 is formed over each bonding pad 202, in which the UBM 206 covers the bonding pads 202 and the sidewalls of the first openings 210. In this embodiment, the UBM 206 is formed such that it overlaps over the stress buffer layer 209. In the first embodiment of the present invention, the UBMs 206 only cover the bonding pads 202. While, in the second embodiment, an isolation layer 207 should be formed on the passivation layer 204 and stress buffer layer 209.

Then, another patterned photoresist 214 is formed covering the stress buffer layer 209 and the scribe lines 212. The patterned photoresist 214 has a plurality of second openings 215 that are aligned with the first openings 210. Then, a solder material 216 is filled in the first and second openings 210 and 215. As an example, in the present embodiment of the present invention, the size of the second openings 215 is greater than that of the first openings 210. The solder material 216 is, for example, a tin-lead paste that can have various ratios of $Sn_x Pb_y$, wherein x+y=100. However, the solder material 216 also can be composed of other solder constituents not recited here.

Figure 8:
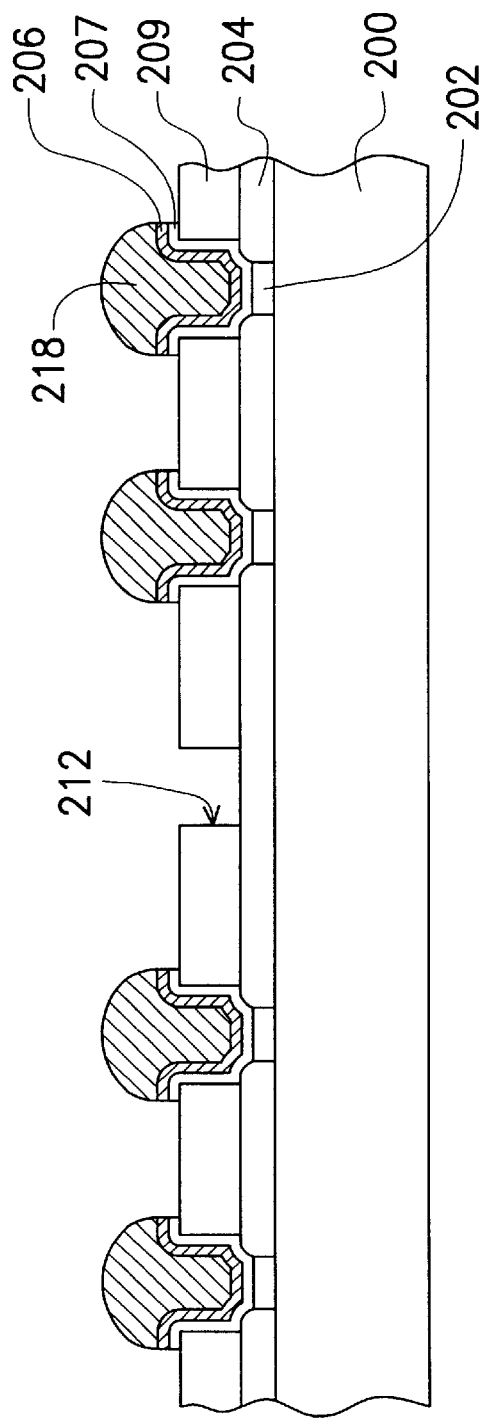

Referring to FIG. 8, a plurality of bumps 218 is formed after reflow of the solder material 216. The thus-formed bumps 218 have a portion thereof overlapping over the stress buffer layer 209. The patterned photoresist 214 and the isolation layer 207 not covered by the bumps are then removed. The isolation layer 207 is directed to ensure the effective and complete removal of the patterned photoresist 214 after reflowing.

With the method of the present invention, the stress buffer layer, the bumps and the scribe lines are all formed on the wafer, resulting in a simplified wafer level packaging.

Further, since the scribe lines are defined via a patterned photoresist formed on the wafer, the wafer, after being packaged, can be simply diced without misalignment problems. Warping of the wafer that might occur during subsequent thermal processes can be avoided because of the scribe lines.

The thus-singularized chips can be flipped and directly connected onto the printed circuit substrate or carrier after the wafer is diced, wherein the stress buffer layer advantageously eliminates the conventional underfill process. With replacement of the conventional underfill by the stress buffer layer of the present invention, the packaging is easy to achieve with a lower cost.

With the above-described method, even in the case where the pitch of the bumps is reduced, the limitations of the conventional underfill process can still be advantageously overcome while the wafer-level packaging process is also simplified.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. A wafer-level packaging process, performed on a wafer that has a plurality of chips with a plurality of bonding pads thereon exposed through a passivation layer that covers the wafer, the wafer-level packaging process comprising:

forming a first patterned photoresist to define a plurality of scribe lines and a plurality of bump forming locations where a plurality of bumps are to be respectively formed corresponding to the bonding pads said first patterned photoresist covers the bump forming locations and scribe lines;

forming a stress buffer layer that covers the regions not covered by the first patterned photoresist;

removing the first photoresist such that the stress buffer layer has a plurality of first openings exposing the bump forming locations;

respectively forming an under ball metallurgy on the bonding pads, wherein the UBM an under ball metallurgy respectively covers the bonding pads, the sidewalls of the first openings and overlaps over the stress buffer layer;

forming a second patterned photoresist having a plurality of second openings to cover the stress buffer layer and scribe lines, wherein the first openings are exposed through the second openings;

filling a solder material in the first and second openings; and performing a reflow process, and then removing the second patterned photoresist.

2. The wafer-level packaging process of claim 1, wherein the stress buffer layer is formed by screen printing.

3. The wafer-level packaging process of claim 1, wherein the stress buffer layer is formed by dispensing.

4. The wafer-level packaging process of claim 1, wherein the stress buffer layer is made of epoxy.

5. The wafer-level packaging process of claim 1, further comprises forming an isolation layer over the bonding pads, the sidewalls of the first openings and the stress buffer layer to ensure a complete removal of the second patterned photoresist after the reflow process.

* * * * *